United States Patent
Vu et al.

(10) Patent No.: US 7,138,877 B2
(45) Date of Patent: Nov. 21, 2006

(54) PLL AND METHOD FOR PROVIDING A SINGLE/MULTIPLE ADJUSTABLE FREQUENCY RANGE

(75) Inventors: Roxanne Vu, San Jose, CA (US); Huy Nguyen, San Jose, CA (US); Benedict Lau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/828,667

(22) Filed: Apr. 21, 2004

(65) Prior Publication Data

US 2005/0237117 A1    Oct. 27, 2005

(51) Int. Cl.
*H03L 7/00* (2006.01)
(52) U.S. Cl. ............................................. 331/2; 331/56
(58) Field of Classification Search .................... 331/2, 331/16–17, 46, 48–49, 56; 327/147–148, 327/156–157
See application file for complete search history.

(56) References Cited

U.S. PATENT DOCUMENTS

| | | | | |
|---|---|---|---|---|
| 5,389,898 A | * | 2/1995 | Taketoshi et al. ............... | 331/2 |
| 5,742,798 A | | 4/1998 | Goldrian | |
| 6,031,426 A | * | 2/2000 | Yechuri ........................... | 331/2 |
| 6,188,285 B1 | * | 2/2001 | Nakanishi et al. ............... | 331/2 |
| 6,304,146 B1 | * | 10/2001 | Welland ......................... | 331/2 |
| 6,650,141 B1 | * | 11/2003 | Agrawal et al. ............... | 326/41 |
| 6,785,525 B1 | * | 8/2004 | Ries ............................ | 455/258 |
| 6,788,155 B1 | * | 9/2004 | Chaudhuri et al. ............ | 331/2 |
| 6,954,091 B1 | * | 10/2005 | Wurzer ........................ | 327/156 |
| 2003/0137328 A1 | | 7/2003 | Kurd et al. | |

FOREIGN PATENT DOCUMENTS

JP        02000035831 A        2/2000

* cited by examiner

*Primary Examiner*—Timothy P. Callahan
*Assistant Examiner*—Cassandra Cox
(74) *Attorney, Agent, or Firm*—Vierra Magen Marcus & DeNiro LLP

(57) ABSTRACT

A PLL circuit and method provides an adjustable operating frequency range by using at least two VCOs. In an embodiment of the present invention, circuit components of a PLL are adjusted in order to obtain a selected frequency range. In particular, a gain of a charge pump and resistance of a filter is adjusted responsive to a control signal. In alternate embodiments of the present invention, a voltage regulator, including an operational amplifier, is coupled to the output of the filter and the respective inputs of two VCOs. An output multiplexer then selects a VCO output responsive to the control signal. In another embodiment of the present invention, a multiplexer is coupled to the output of the voltage regulator to select which VCO receives a buffered voltage. In another embodiment of the present invention, respective operational amplifiers that may be enabled or disabled responsive to the control signal are coupled to a filter output and respective VCO inputs in order to provide an adjustable frequency range.

34 Claims, 8 Drawing Sheets

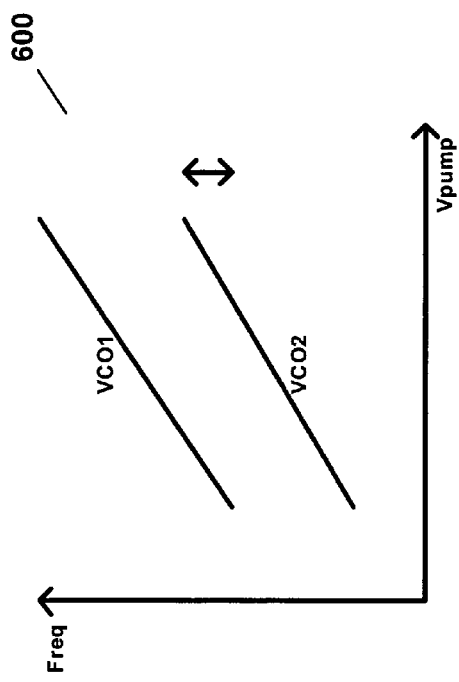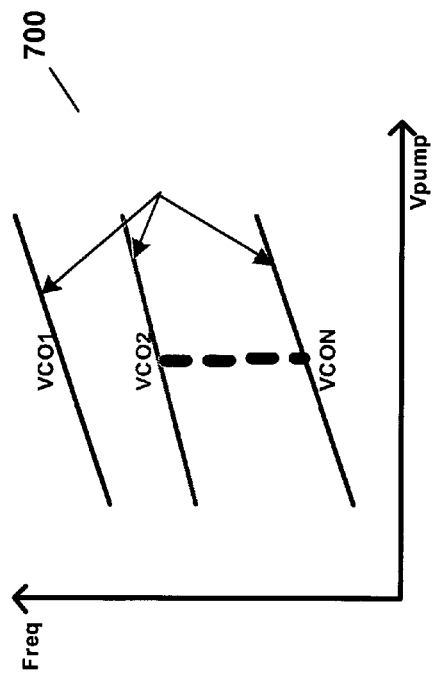

PLL AND METHOD FOR PROVIDING A SINGLE/MULTIPLE ADJUSTABLE FREQUENCY RANGE

FIELD OF THE INVENTION

The present invention relates to a circuit tracking an input signal, and in particular, a phase locked loop ("PLL").

BACKGROUND OF THE RELATED ART

A PLL is an electronic circuit, which generates an output signal that has a well-controlled relationship in phase and frequency to an input signal. PLLs are used in numerous applications including, for example, I/O interfaces of digital integrated circuits, memory systems, processors, frequency multiplication or frequency tracking. A PLL may be included in a multi-data rate interface that transfers data at different data rates or a circuit that operates in different modes of operation, such as a typical transfer mode of operation and a debug/test mode of operation.

Accordingly, it is desirable to have a PLL that can operate at a selected frequency range for a particular mode of operation or operate at multiple discrete frequency ranges.

However, a PLL is typically designed to operate at the highest specified input frequency. A frequency range of a voltage-controlled oscillator ("VCO"), in the PLL, generally operates at about two times the minimum specified input frequency of the PLL. So, often a designer would implement VCOs with high frequency ranges in order to meet specified high frequency inputs; while increasing the minimum input operating frequency of the PLL. Although, by designing for high frequency input performance, PLL performance at lower input frequencies degrades.

A PLL may be modified to enable improved performance at lower input frequencies; however, the modified PLLs have certain disadvantages. First, a programmable divider may be added to the output signal of a PLL. Thus, a high frequency output signal is divided down to a selected lower frequency. However, the period of the lower frequency output signal is limited to integral multiples of the specified high frequency. Further, for applications that use a large number of clock buffers for the output signal, a programmable divider positioned after the clock buffers will cause the PLL using clock buffers to draw more power than would be necessary at lower frequencies.

Second, a modified PLL may include a VCO with switchable capacitance. However, maximum frequency of the VCO will be reduced by the addition of the load of the switch. Also, capacitance that increases circuit area would be required for a low frequency.

Third, a modified PLL may include a VCO with multiple taps similar to a divider circuit. However, this will create an uneven mixer output phase, and increase circuit complexity.

Fourth, two or more PLLs may be used. However, this will increase power consumption, circuit area, and circuit complexity.

Therefore, it is desirable to provide a PLL that can operate in a selected operating frequency range without the above-described disadvantages, to accommodate a PLL application that may communicate with different signal levels or with multiple discrete operating frequencies (i.e. multi-data rate, bi-modal, multi-modal integrated circuits).

BRIEF DESCRIPTION OF THE DRAWING

The present invention is illustrated by way of example, and not by way of limitation, in the figures of the accompanying drawings and in which like reference numerals refer to similar elements in which:

FIGS. 6–7 illustrate frequency ranges as a function of charge pump voltage ($V_{pump}$) according to embodiments of the present invention.

DETAILED DESCRIPTION

A PLL circuit and method provides multiple adjustable operating frequency ranges by using at least two VCOs. In an embodiment of the present invention, circuit components of a PLL are adjusted in order to obtain a desired loop bandwidth for a selected frequency range. In particular, a gain of a charge pump and resistance of a filter is adjusted responsive to a control signal. In alternate embodiments of the present invention, a voltage regulator, including an operational amplifier, is coupled to the output of the filter and the respective inputs of two VCOs. An output multiplexer then selects a VCO output responsive to the control signal. In another embodiment of the present invention, a multiplexer is coupled to the output of the voltage regulator to select which VCO receives a buffered voltage. In another embodiment of the present invention, respective operational amplifiers that are selectively enabled responsive to the control signal are coupled to a filter output and respective VCO inputs in order to provide an adjustable frequency range.

Figure 1A:
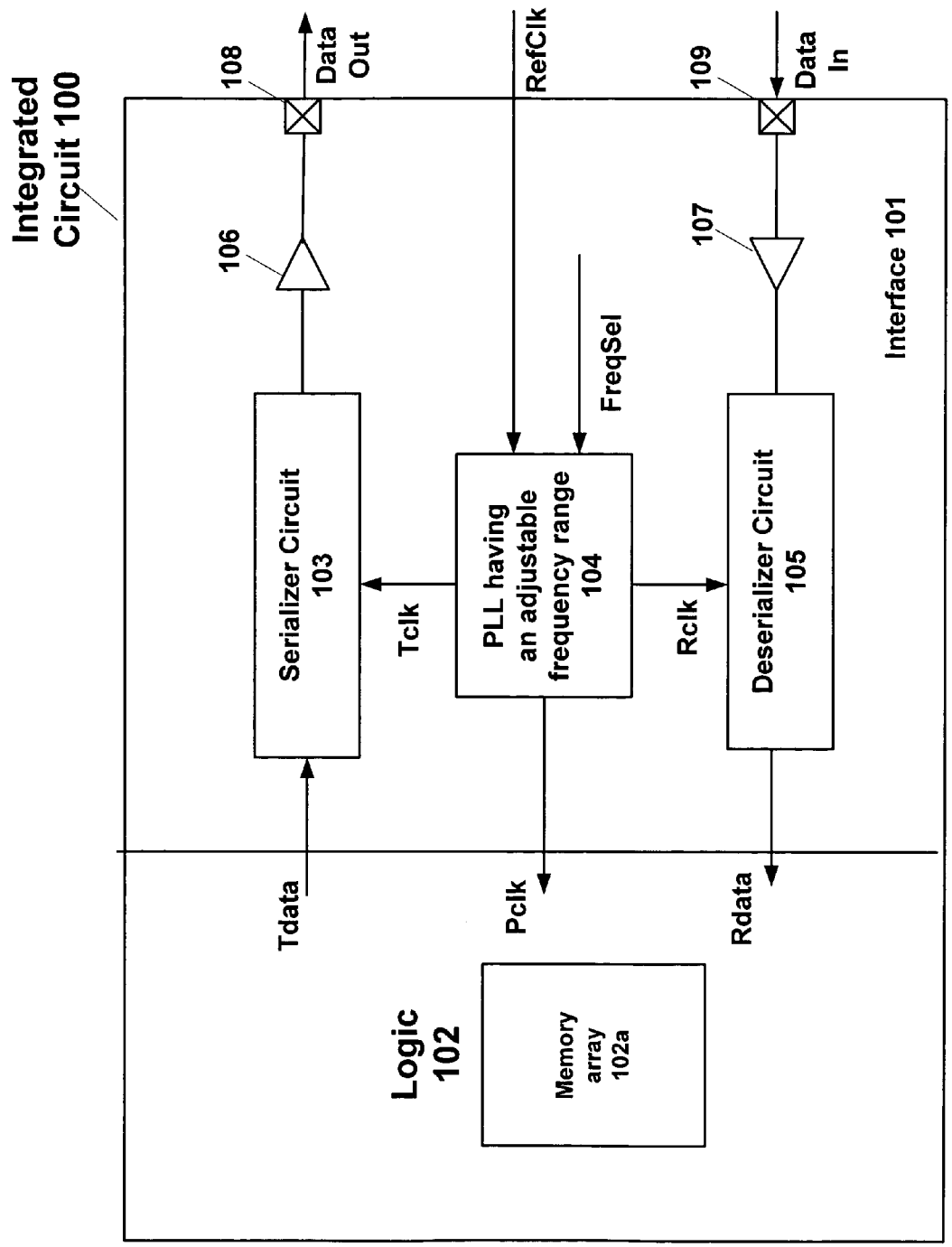
FIG. 1a illustrates an integrated circuit ("IC") 100 having a multi-data rate interface including a PLL for providing an adjustable frequency range according to an embodiment of the present invention.

FIG. 1a illustrates an IC 100 including a PLL 104 having an adjustable operating frequency range. IC 100 is used to transmit and receive data having different data rates in embodiments of the present invention. IC 100 includes an Interface circuit 101 and logic circuit 102. Interface circuit 101 includes conducting elements 108 and 109 for transmitting Data-Out signals and receiving Data-In signals, respectively.

Signals described herein may be transmitted or received between components by electrical or optical conductors and generated using any number of signaling techniques including without limitation, modulating the voltage or current level of an electrical signal or modulating the intensity or other characteristic of an optical signal. The signals may represent any type of control and timing information (e.g. commands, address values, clock signals, configuration information) as well as data. Also, a single signal may represent a plurality of signals on respective signal lines in an embodiment of the present invention.

In an embodiment of the present invention, an interconnect between components is represented as a single line in the figures and represents a conductive element, wire or trace for transferring a signal between components. In an alternate embodiment of the present invention, a single line between components shown in the figures represents multiple interconnections or a bus.

In an embodiment of the present invention, conducting elements 108 and 109 include a contact, surface, pin, wire lead or solder ball, singly or in combination, to provide electrical connections between Interface circuit 101 and external signal line traces for conducting Data-Out and Data-In signals, respectively. In an embodiment of the present invention, IC 100 is coupled to a printed circuit board or card including a plurality of signal line traces.

Serializer circuit 103 and transmitter 106 provide a Data-Out signal on conducting element 108 in response to a Tdata signal from logic circuit 102. Transmitter 106 outputs a Data-Out signal synchronously with respect to rising and falling edges of a clock signal in an embodiment of the present invention. A Tdata signal represents a plurality of parallel signals that are then serialized by serializer circuit 103 in an embodiment of the present invention.

Deserializer circuit 105 and receiver 107 provide a Data-In signal from conducting element 109 as an Rdata signal to logic circuit 102. Receiver 107 obtains a Data-In signal synchronously with respect to rising and falling edges of a clock signal in an embodiment of the present invention. An Rdata signal represents a plurality of parallel signals that have been deserialized by deserializer circuit 105.

A PLL circuit 104 outputs Pclk, Transmit clock ("Tclk") and Receive clock ("Rclk") signals to logic circuit 102, serializer circuit 103, and deserializer circuit 105, respectively, in response to a RefClk and FreqSel signal. In an embodiment of the present invention, Pclk, Tclk and Rclk signals are the same signal and have the same frequency and phase. In an alternate embodiment of the present invention, Pclk, Tclk and Rclk signals are different signals having different frequencies and/or phases. Frequency multipliers and/or dividers at the output of PLL 104 in an embodiment of the present invention provide different signal frequencies. In an alternate embodiment of the present invention, multiple output signals to logic circuit 102 are represented as a Pclk signal. In an embodiment of the present invention, a RefClk signal is a reference clock signal provided by an external clock source. In an embodiment of the present invention, a FreqSel signal is included in a Data-In signal, or alternatively provided on a dedicated signal line trace. In an alternate embodiment of the present invention, a FreqSel signal indicates the desired operating frequency range of PLL 104. In an embodiment of the present invention, a FreqSel signal represents an encoded control word or is voltage value indicating a selected frequency range. In an embodiment of the present invention, an external processor, external logic or master device, singly or in combination, generates the RefClk and FreqSel signals.

In an embodiment of the present invention, IC 100 includes a substrate for forming a discretely packaged monolithic integrated circuit or device. In an embodiment of the present invention, IC 100 is a memory device that has a plurality of storage cells, collectively referred to as a memory array 102a. A memory device stores data (which may be retrieved) associated with a particular address provided, for example) as part of a write or read command. In an embodiment of the present invention, a write or read command is included in a Data-In signal. A memory device typically includes request decode and array access logic, such as logic circuit 102, that, among other functions, decodes request and address information, and controls memory transfers between memory array 102a and Interface circuit 101. In an embodiment of the present invention, read data from memory array 102a is output as a Data-Out signal.

Examples of types of memory devices include dynamic random access memory ("DRAM"), static random access memory ("SRAM"), double data rate SDRAM ("DDR"), Direct Rambus® memory ("DRDRAM"), "XDR™" memory devices, Ferroelectric RAM, ("FRAM"), Magnetoresistive or Magnetic RAM ("MRAM"), Flash, or read-only memory ("ROM").

In an alternate embodiment of the present invention, a memory device, such as IC 100, is included in a memory module that includes a package housing or structure having a plurality of memory devices employed with a connector interface.

In an alternate embodiment, IC 100 does not include a memory array 102a and logic circuit 102 includes a signal processing circuit.

Figure 1B:
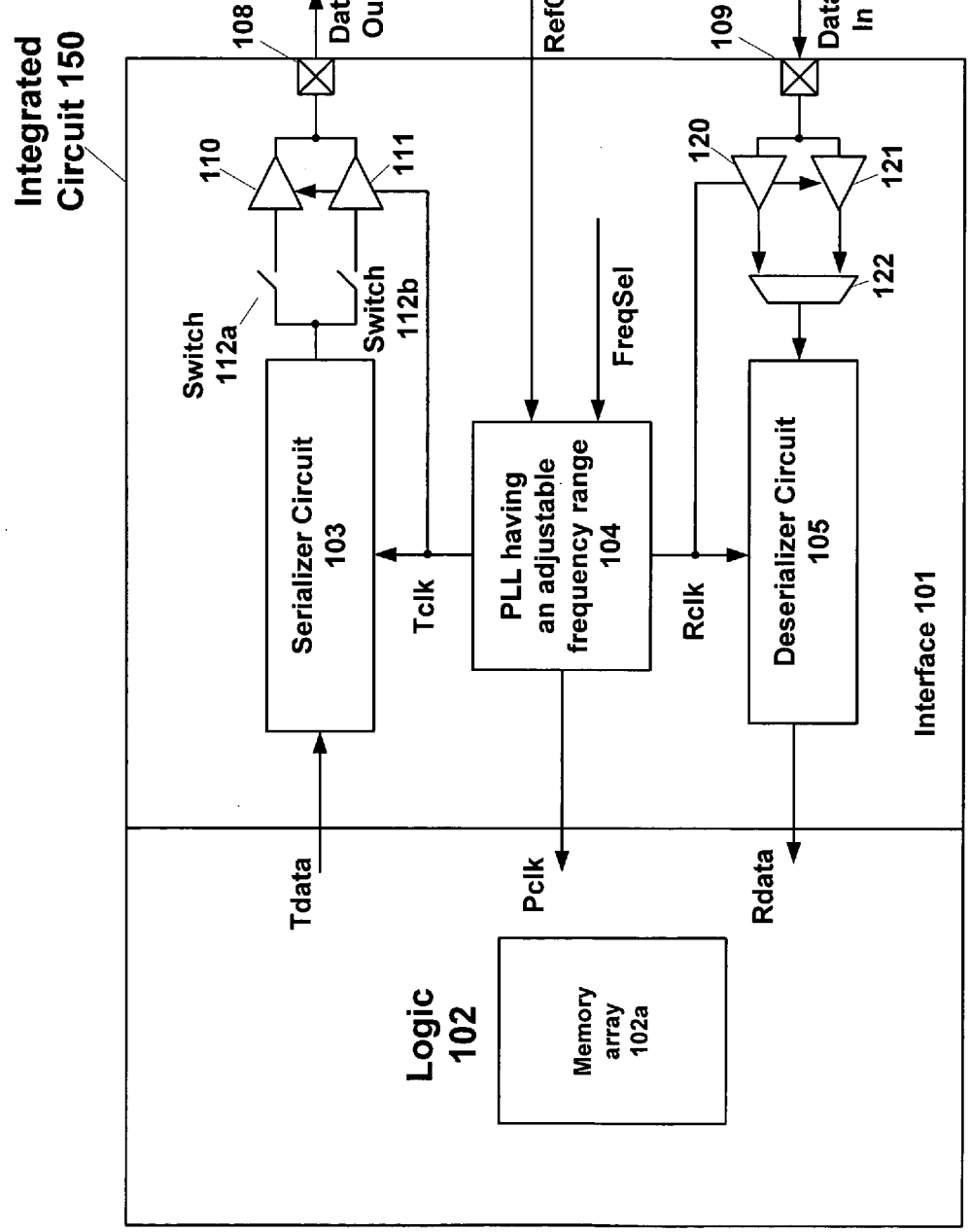
FIG. 1b illustrates a circuit 150 having at least two modes of operation including a PLL for providing an adjustable frequency range according to an embodiment of the present invention.

FIG. 1b illustrates an IC 150 operating in at least two modes of operation. In an embodiment of the present invention, a first mode of operation includes a typical mode of operation, such as a read/write mode of operation for a memory device; while a second mode of operation includes a test or debug mode of operation. For example, a first mode of operation includes closing switch 112a (and opening switch 112b) while enabling transmitter 110 and receiver 120. A second mode of operation includes closing switch 112b (and opening switch 112a) while enabling transmitter 111 and receiver 121. Third and fourth modes of operation include operating the first and second modes at a significantly lower frequency range than is used in the first and second modes of operation. IC 150 includes a PLL 104 having an adjustable operating frequency range according to an embodiment of the present invention in which PLL 104 operates in a first frequency range in a first mode of operation and a second frequency range in a second mode of operation. For example, PLL 104 is configured for input frequencies ranging between approximately 1 Ghz and approximately 500 Mhz for a typical read/write memory device mode of operation and configured for input frequencies ranging between approximately 700 Mhz and approximately 200 Mhz for a test mode of operation of IC 150.

IC 150 is similar to IC 100 except that switches 112a–b and transmitters 110 and 111 are used for a first and second mode of operation, respectively. Switches 112a–b and transmitters 110 or 111 are selected or enabled in response to a control signal. In embodiments of the present invention, a master device, such as a processor or controller, core logic, process or state detector, software and/or a user selection, singly or in combination, generates control signals to components described herein. Likewise, receivers 120 and 121 along with multiplexer 122 are selected or enabled responsive to a control signal indicating a mode of operation.

Figure 2:
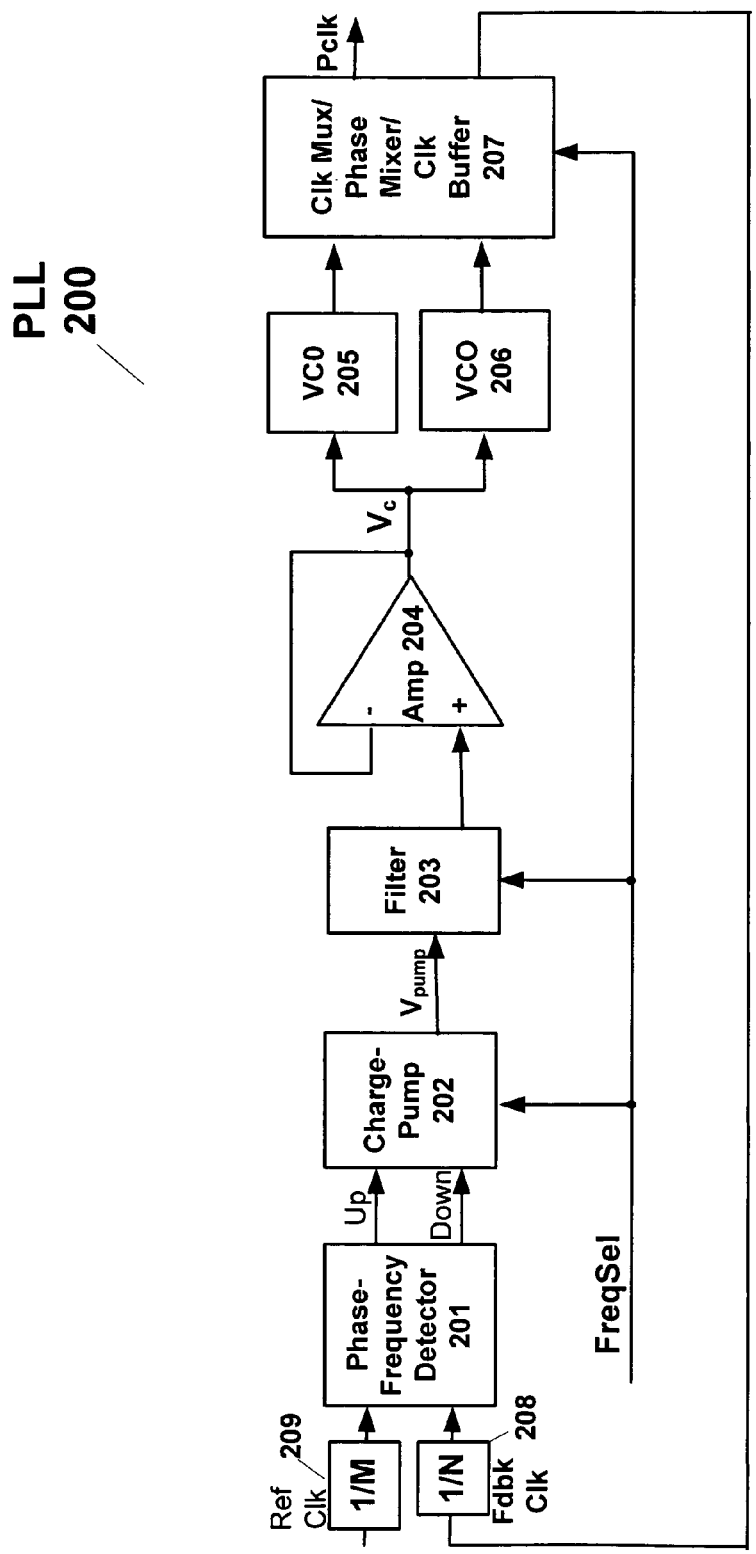
FIG. 2 illustrates a PLL 200 according to an embodiment of the present invention.

FIG. 2 illustrates a PLL 200 having an adjustable operating frequency range according to an embodiment of the present invention. PLL 200 is used as PLL 104 shown in FIGS. 1a–b in embodiments of the present invention. In an embodiment of the present invention, circuit components of PLL 200 are adjusted in response to a control signal so that PLL 200 operates at a selected input frequency range. PLL 200 is said to be in a phase-locking mode, and the oscillation period of the output signal Pclk, also labeled a FdbkClk signal, is adjusted in a phase-locking operation to track the phase of a RefClk signal.

PLL 200 includes circuit components such as divider circuits 208 and 209, phase-frequency detector 201, charge-pump 202, filter 203, a voltage regulator including operational amplifier ("Amp") 204, VCOs 205 and 206, and Clock multiplexer ("clk mux")/phase mixer/clk buffer 207. As one of ordinary skill in the art would appreciate, more or less circuit components are provided in alternate embodiments of the present invention. For example, PLL 200 does not include divider circuits 208 and 209 and Amp 204 in embodiments of the present invention. In embodiments of the present invention, one or more control signals, such as FreqSel signal, is provided to one or more circuit components of PLL 200 so that PLL 200 is able to operate within a selected input frequency range.

RefClk and FdbkClk signals are input to divider circuits 209 and 208 in an embodiment of the present invention. Divider circuit 209 divides the RefClk signal frequency by M and divider circuit 208 divides the FdbkClk signal frequency by N. Divider circuit 209 is a 1/M circuit and divider circuit 208 is a 1/N circuit, where M does not equal N, in an embodiment of the present invention.

Phase-frequency detector 201 compares an input signal, such as a RefClk signal, to a FdbkClk signal and generates a phase difference to charge pump 202. For example, up and down signals are generated by phase-frequency detector 201. Charge pump 202 includes a gain or corresponding current that is adjustable, or in other words increased or decreased, responsive to a FreqSel signal. A $V_{pump}$ voltage is then provided to filter 203. In an embodiment of the present invention, filter 203 is a low pass filter including an adjustable resistor that is increased or decreased responsive to a FreqSel signal. A voltage is then provided to a voltage regulator and in particular Amp 204 in an embodiment of the present invention. Amp 204 acts as a buffer and generates a buffered voltage $V_c$ to VCOs 205 and 206. In an embodiment of the present invention, VCO 205 outputs an oscillating signal having a first frequency range responsive to voltage $V_c$ and VCO 206 outputs an oscillating signal having a second frequency range responsive to voltage $V_c$.

Clk mux/phase mixer/clk buffer 207 outputs Pclk and Fdbck signals responsive to the oscillating signals from VCOs 205 and 206. In an embodiment of the present invention, clk mux/phase mixer/clk buffer 207 includes a multiplexer for selecting which VCO output is used (either VCO 205 or VCO 206) to output Pclk and FdbkClk signals. In an embodiment of the present invention, the multiplexer selects a particular output responsive to a FreqSel signal. In an embodiment of the present invention, clk mux/phase mixer/clk buffer 207 includes a phase mixer and/or clock buffers for outputting Pclk and FdbkClk signals.

PLL 200 requires less area in an integrated circuit compared to other embodiments described herein (for example PLL 300 described below); however, both VCOs 205 and 206 are generally on and may cause more noise to be injected into an output signal of PLL 200.

Figure 3:
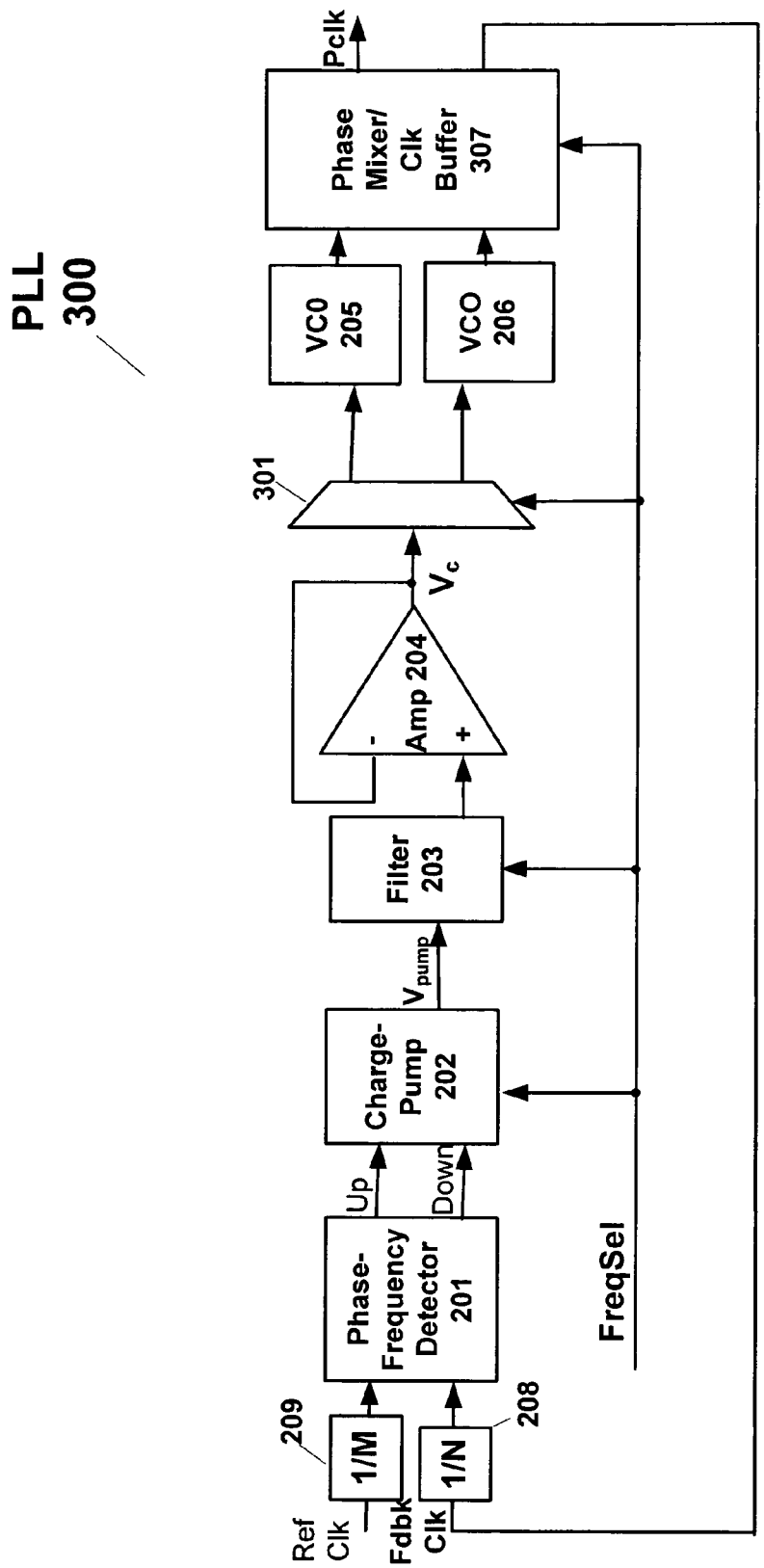
FIG. 3 illustrates a PLL 300 according to an embodiment of the present invention.

FIG. 3 illustrates a PLL 300 having an adjustable operating frequency range according to an embodiment of the present invention. PLL 300 is used as PLL 104 shown in FIGS. 1a–b in embodiments of the present invention. PLL 300 operates similar to PLL 200 described above except that PLL 300 includes a multiplexer 301 for inputting buffered voltage $V_c$ from Amp 204 to either VCO 205 or 206 responsive to a FreqSel signal. Also, phase mixer/clk buffer 307 includes a phase mixer and clock buffers for outputting Pclk and FdbkClk signals responsive to an oscillating signal from either VCO 205 or 206. In an embodiment of the present invention, a FreqSel signal is input into phase mixer/clk buffer 307 for optimizing performance.

PLL 300 does not inject as much noise into an output signal, as compared to PLL 200, because both VCOs 205 and 206 are not operating at the same time; however, PLL 300 uses more area because switches in multiplexer 301 are larger than would be required if used in phase mixer/clk buffer 307. Also, PLL 300 may not operate properly at low VDD because multiplexer 301 acts as a large switch requiring extra headroom to pass on buffered voltage $V_c$ to either VCO 205 or 206.

Figure 4:
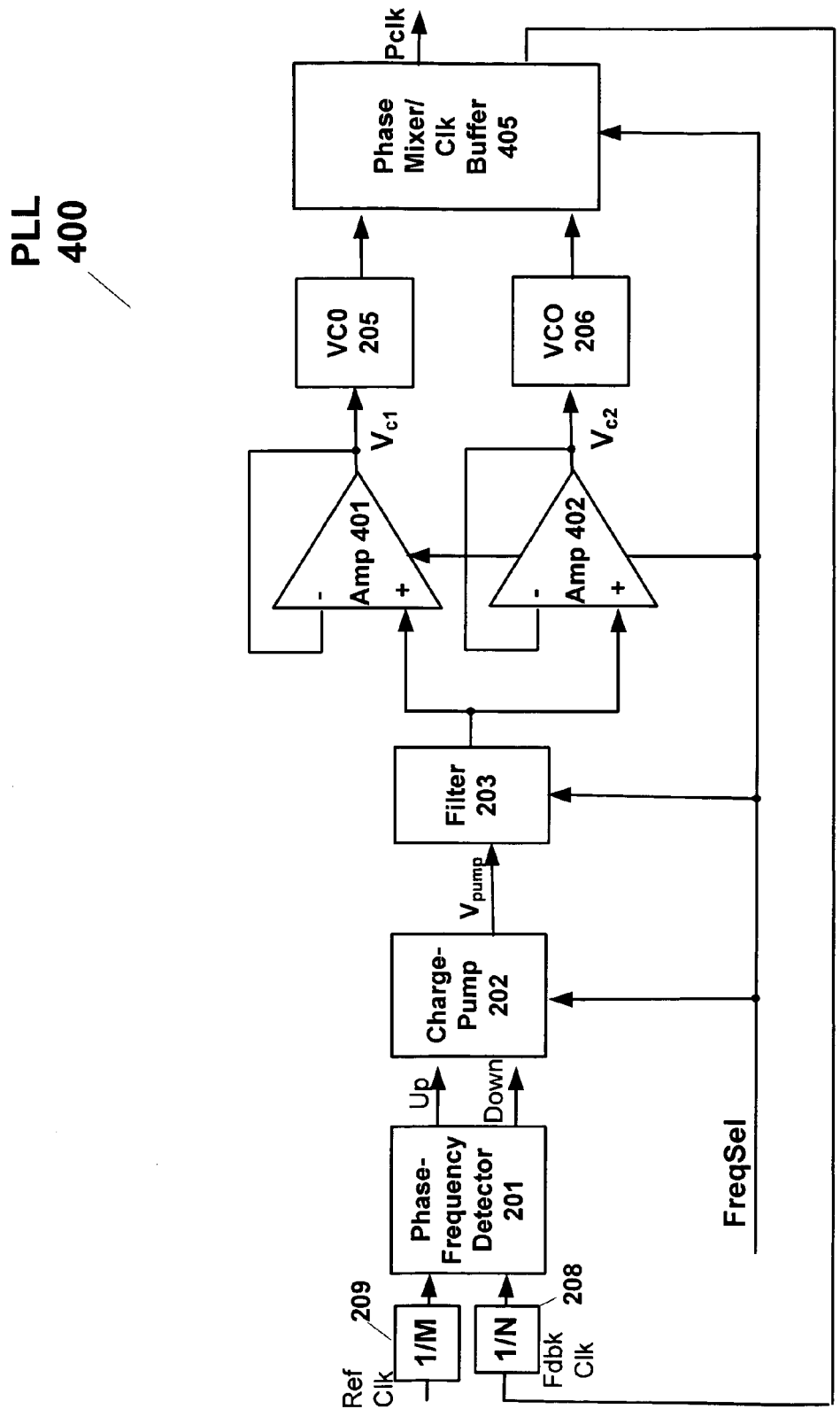
FIG. 4 illustrates a PLL 400 according to an embodiment of the present invention.

FIG. 4 illustrates a PLL 400 having an adjustable operating frequency range according to an embodiment of the present invention. PLL 400 is used as PLL 104 shown in FIGS. 1a–b in embodiments of the present invention. PLL 400 operates similar to PLL 200 described above except that PLL 400 includes two voltage regulators, including Amps 401 and 402, for providing buffered voltages $V_{c1}$ and $V_{c2}$ to VCOs 205 or 206, respectively, responsive to a FreqSel signal. Amps 401 and 402 are enabled or disabled in response to a FreqSel signal in order to select which VCO (either VCO 205 or VCO 206) receives a buffered voltage (either buffered voltage $V_{c1}$ or buffered voltage $V_{c2}$). Also, phase mixer/clk buffer 405 includes a phase mixer and clock buffers for outputting Pclk and FdbkClk signals responsive to an oscillating signal from either VCO 205 or VCO 206. In an embodiment of the present invention, a FreqSel signal is input into phase mixer/clk buffer 307 for optimizing performance.

PLL 400 does not inject as much noise into an output signal, as compared to PLL 200, because both VCOs 205 and 206 are not generally operating at the same time (similar to PLL 300); however, PLL 400 uses more area because two voltage regulators are used.

Figure 5:
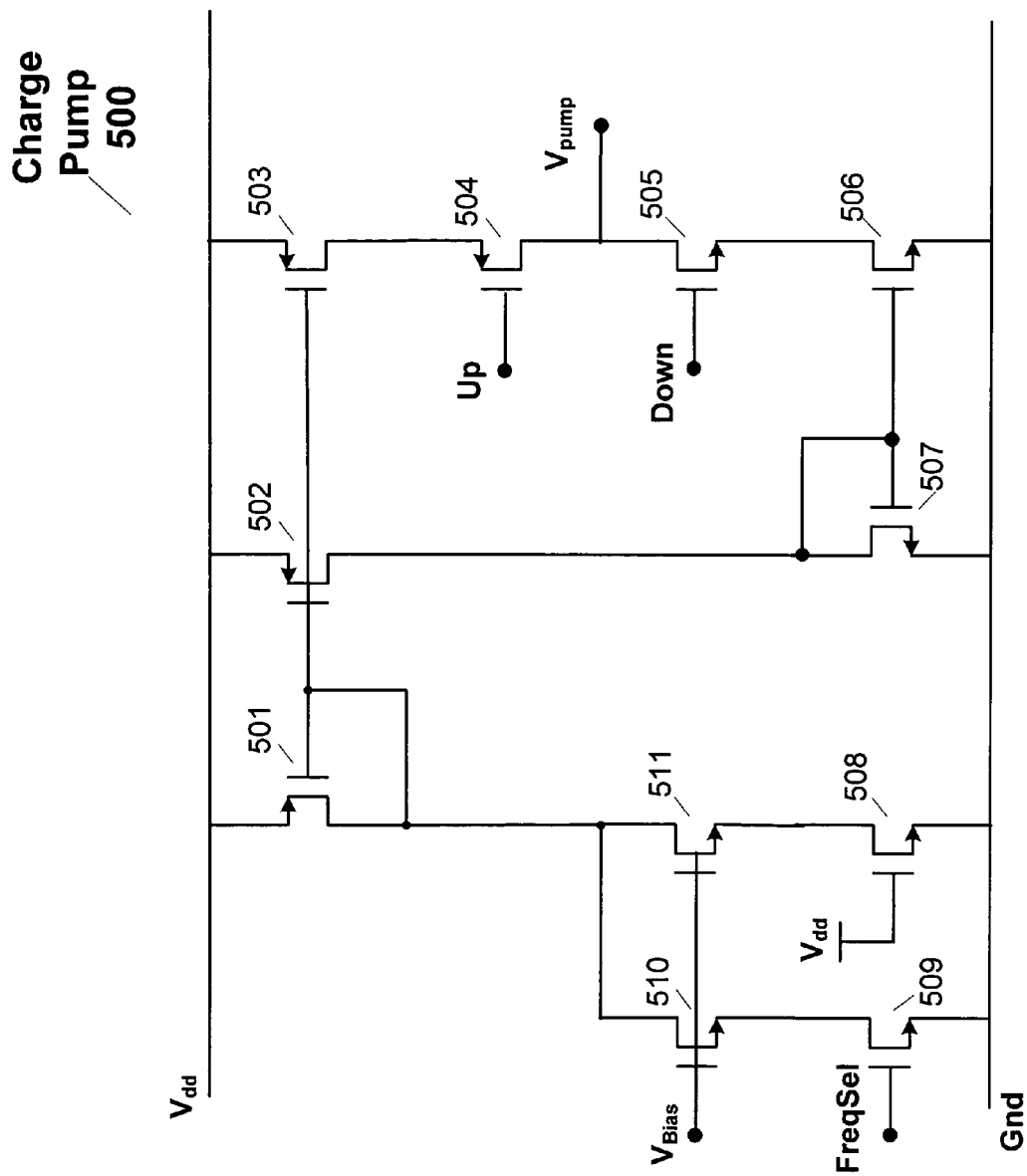
FIG. 5 is a schematic of a charge pump 500 according to an embodiment of the present invention.

FIG. 5 illustrates a charge pump 500 according to an embodiment of the present invention. In particular, charge pump 500 is used as charge pump 202 shown in FIGS. 2–4 and described above in an embodiment of the present invention. Charge pump 500 outputs a voltage $V_{pump}$ responsive to Up and Down signals applied to gates of transistors 504 and 505 (charge pump inputs), respectively, and a voltage $V_{bias}$ and FreqSel signal applied to gates of transistors 510 and 509, respectively. Charge pump 500 includes four p-type transistors 501–504, where transistors 501–503 have sources coupled to voltage $V_{dd}$. Gates of transistors 501–503 also are coupled. Gates of transistors 501 and 502 are coupled to a drain of transistor 501. A drain of transistor 503 is coupled to a source of transistor 504 that has a drain coupled to an output of charge pump 500 and a drain of transistor 505. Charge pump 500 also includes seven n-type transistors 505–511 in an embodiment of the present invention. An n-type transistor 505 has a source coupled to a drain of transistor 506 that has a source coupled to ground Gnd. A gate of transistor 506 is coupled to a gate of transistor 507. A source of transistor 507 is coupled to ground Gnd and a drain is coupled to gates of transistors 507 and 506 as well as a drain of transistor 502. Drains of transistors 510 and 511 are coupled to a drain of transistor 501. Gates of transistors 510 and 511 are coupled and biased by voltage $V_{bias}$. In an embodiment of the present invention, voltage $V_{bias}$ is provided as a ratio of $V_{pump}$ (or a constant K multiplied by $V_{pump}$). Sources of transistors 510 and 511 are coupled to drains of transistors 509 and 508, respectively. Voltage $V_{dd}$ is provided to a gate of transistor 508. Sources of transistors 509 and 508 are coupled to ground Gnd. A gain of charge pump 500 is increased or decreased responsive to a FreqSel signal being applied to a gate of transistor 509. For example, increased current is drawn through transistor 509 resulting in an increased voltage value at an output of charge pump 500 (voltage $V_{pump}$) when a FreqSel signal includes an increased positive voltage applied to a gate of transistor 509. Similarly, a voltage value (voltage $V_{pump}$) is decreased when a FreqSel signal includes a decreased positive voltage applied to a gate of transistor 509.

FIG. 6 illustrates frequencies ("Freq") of VCOs 205 and 206 (shown as VCO1 and VCO2) as a function of voltage $V_{pump}$ in a multi-data rate embodiment of the present invention. Graph 600 illustrates overlap frequency coverage for a continuous adjustable frequency range for a PLL used when transmitting and receiving data at different rates. VCO1 provides a relatively high frequency range as compares to VCO2. Accordingly, VCO1 is used for high frequency data transfer rates and VCO2 is used for relatively low frequency data transfer rates.

FIG. 7 illustrates operating frequencies ("Freq") of VCOs 205 and 206 (shown as VCO1 and VCO2 (and VCON)) as a function of voltage $V_{pump}$ in a multi-modal embodiment of the present invention. Graph 700 illustrates multiple discrete frequency ranges for a PLL operating in different modes of operation. VCO1 provides a relatively high frequency range for a first mode of operation while VCO2 and VCON provide lower frequency ranges for a second and third mode of operation.

Figure 8:
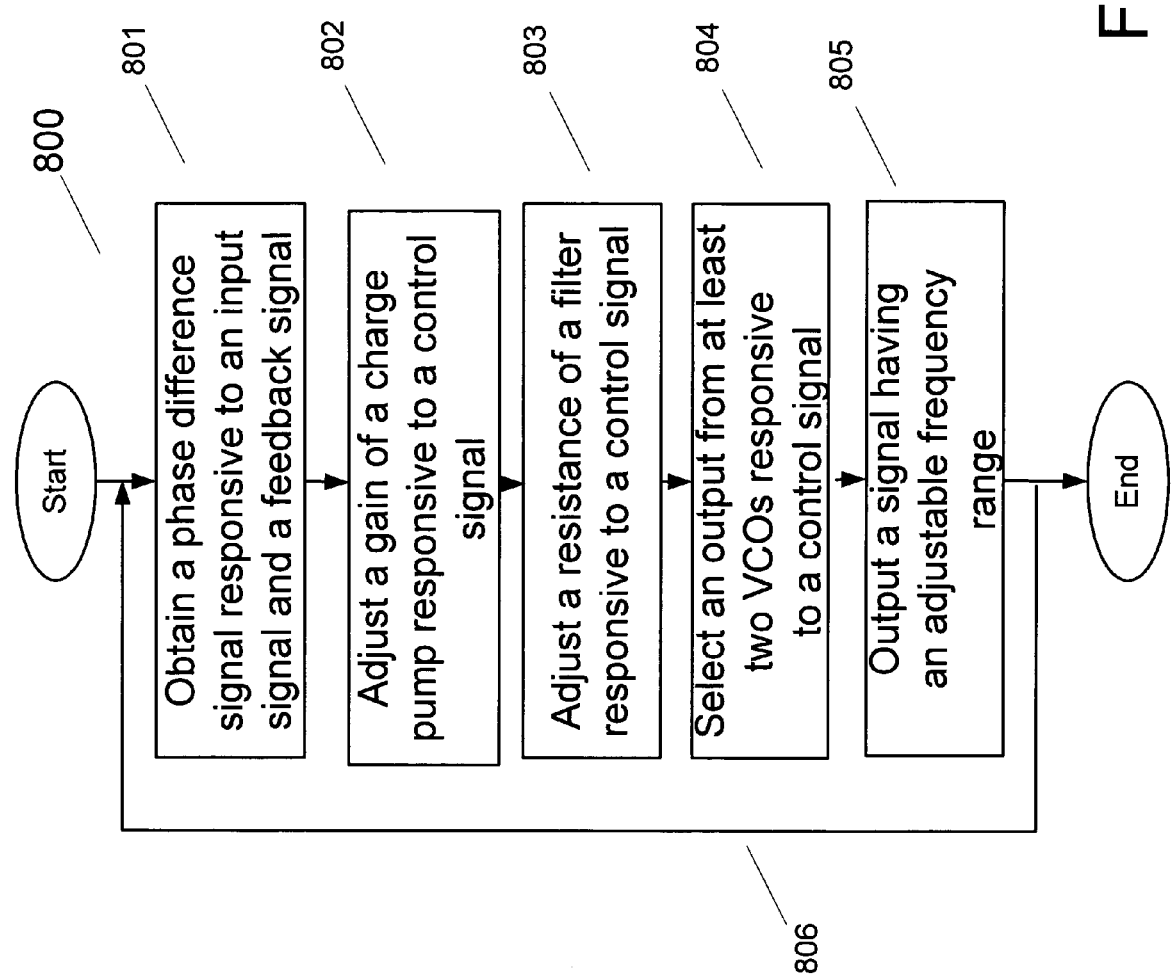
FIG. 8 is a method according to an embodiment of the present invention.

FIG. 8 illustrates a method 800 according to an embodiment of the present invention. In alternate embodiments of the present invention, steps or logic blocks illustrated in FIG. 8 are carried out by hardware, software or a combination thereof. In alternate embodiments, the circuit components illustrated in FIGS. 1–5, carry out the steps illustrated in FIG. 8. As one of ordinary skill in the art would appreciate, other steps that are not shown may be included in various embodiments of the present invention. Also, while method 800 is described in sequential steps, one of ordinary skill in the art would appreciate that method steps or logic blocks of method 800 are completed very quickly or almost instantaneously.

Method 800 begins at logic block 801 where a phase difference signal is obtained responsive to an input signal and a feedback signal. In an embodiment of the present invention, phase-frequency detector 201 outputs up and down signals responsive to a RefClk signal and a FdbkClk signal. Logic block 802 illustrates adjusting a circuit component in a PLL in order to obtain a selected frequency range. In particular, a gain of a charge pump is adjusted in response to a control signal. Likewise, a resistance is adjusted as illustrated by logic block 803. In an embodiment of the present invention, a variable resistance in filter 203 is adjusted. Logic block 804 illustrates selecting an output of multiple different VCOs responsive to a control signal. In an embodiment of the present invention, a multiplexer is used for selecting an output. In still a further embodiment of the present invention, a plurality of respective Amps are enabled or disabled responsive to a control signal. An output signal having an adjustable frequency range is then output as illustrated by logic block 805. In an embodiment of the present invention, these steps are repeated as illustrated by loop 806 when a new frequency range is selected.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A phase locked loop circuit, comprising:
    a phase-frequency detector to provide a phase difference signal in response to an input signal and a feedback signal;
    a charge-pump, coupled to the phase-frequency detector, to provide a first voltage in response to the phase difference signal;
    a filter, coupled to the charge-pump, to provide a second voltage in response to the first voltage;
    a first voltage-controlled oscillator, coupled to the filter, to provide the feedback signal in response to the second voltage;
    a second voltage-controlled oscillator, coupled to the filter, to provide the feedback signal in response to the second voltage; and,
    a multiplexer, coupled to the first and second voltage-controlled oscillators, to provide the feedback signal in response to the control signal,
    wherein the charge-pump includes a gain that is adjustable in response to a control signal.

2. The phase locked loop circuit of claim 1, wherein the gain corresponds to a current that is adjustable.

3. A phase locked loop circuit, comprising:
    a phase-frequency detector to provide a phase difference signal in response to an input signal and a feedback signal;
    a charge-pump, coupled to the phase-freuency detector, to provide a first voltage in response to the phase difference signal;
    a filter, coupled to the charge-pump, to provide a second voltage in response to the first voltage;
    a first voltage-controlled oscillator, coupled to the filter, to provide the feedback signal in response to the second voltage; and,
    a second voltage-controlled oscillator, coupled to the filter, to provide the feedback signal in response to the second voltage;
    wherein the charge-pump includes a gain that is adjustable in response to a control signal,
    wherein the filter includes a resistor having a resistance that is adjustable in response to the control signal.

4. The phase locked loop circuit of claim 1, wherein the filter includes a resistor having a resistance that, is adjustable in response to the control signal.

5. The phase locked loop circuit of claim 1, further comprising:
    a voltage regulator, coupled to the filter and the first and second voltage-controlled oscillators, to provide the second voltage.

6. The phase locked loop circuit of claim 5, wherein the voltage regulator includes an operational amplifier.

7. The phase locked loop circuit of claim 1, further comprising:
    a phase mixer coupled to the first and second voltage-controlled oscillators.

8. The phase locked loop circuit of claim 1, further comprising:

a clock buffer coupled to the first and second voltage-controlled oscillators.

9. The phase locked loop circuit of claim 1, wherein the filter includes a low-pass filter.

10. The phase locked loop circuit of claim 1, wherein the phase locked loop circuit is coupled to a serializer circuit and a deserializer circuit.

11. The phase locked loop circuit of claim 10, wherein the phase locked loop circuit, the serializer circuit and deserializer circuit are included in a memory device.

12. A phase locked loop circuit, comprising:
a phase-frequency detector to provide a phase difference signal in response to an input signal and a feedback signal;
a charge-pump, coupled to the phase-frequency detector, to provide a first voltage in response to the phase difference signal;
a filter, coupled to the charge-pump, to provide a second voltage in response to the first voltage;
an amplifier, coupled to the filter, to provide a buffered voltage in response to the second voltage;
a multiplexer, coupled to the amplifier, to provide the buffered voltage in response to a control signal;
a first voltage-controlled oscillator, coupled to the multiplexer, to provide the feedback signal in response to the buffered voltage; and,
a second voltage-controlled oscillator, coupled to the multiplexer, to provide the feedback signal in response to the buffered voltage.

13. The phase locked loop circuit of claim 12, wherein the charge-pump includes a gain that is adjustable in response to the control signal.

14. The phase locked loop circuit of claim 13, wherein the gain corresponds to a current that is adjustable.

15. The phase locked loop circuit of claim 12, wherein the filter includes a resistor having a resistance that is adjustable in response to the control signal.

16. The phase locked loop circuit of claim 12, further comprising:
a phase mixer coupled to the first and second voltage-controlled oscillators.

17. The phase locked loop circuit of claim 12, further comprising:
a clock buffer coupled to the first and second voltage-controlled oscillators.

18. The phase locked loop circuit of claim 12, wherein the filter includes a low-pass filter.

19. The phase locked loop circuit of claim 12, wherein the phase locked loop circuit is coupled to a serializer circuit and a deserializer circuit.

20. The phase locked loop circuit of claim 19, wherein the phase locked loop circuit, the serializer circuit and deserializer circuit are included in a memory device.

21. A phase locked loop circuit, comprising:
a phase-frequency detector to provide a phase difference signal in response to an input signal and a feedback signal;
a charge-pump, coupled to the phase-frequency detector, to provide a first voltage in response to the phase difference signal;
a filter, coupled to the charge-pump, to provide a second voltage in response to the first voltage;
a first amplifier, coupled to the filter, to provide a first buffered voltage in response to the second voltage;
a second amplifier, coupled to the filter, to provide a second buffered voltage in response to the second voltage;
a first voltage-controlled oscillator, coupled to the first amplifier, to provide the feedback signal in response to the first buffered voltage; and,
a second voltage-controlled oscillator, coupled to the second amplifier, to provide the feedback signal in response to the second buffered voltage.

22. The phase locked loop circuit of claim 21, wherein the charge-pump includes a gain that is adjustable in response to a control signal.

23. The phase locked loop circuit of claim 22, wherein the gain corresponds to a current that is adjustable.

24. The phase locked loop circuit of claim 21, wherein the filter includes a resistor having a resistance that is adjustable in response to a control signal.

25. The phase locked loop circuit of claim 21,
wherein the first amplifier is operational in response to a control signal,
wherein the second amplifier is operational in response to the control signal,
wherein the charge-pump includes a gain that is adjustable in response to the control signal,
wherein the filter includes a resistor having a resistance that is adjustable in response to the control signal.

26. The phase locked loop circuit of claim 21, further comprising:
a phase mixer coupled to the first and second voltage-controlled oscillators.

27. The phase locked loop circuit of claim 21, further comprising:
a clock buffer coupled to the first and second voltage-controlled oscillators.

28. The phase locked loop circuit of claim 21, wherein the filter includes a low-pass filter.

29. A method, comprising:
obtaining a phase difference signal in response to an input signal and a feedback signal; and,
providing an adjustable frequency range for the feedback signal in response to a first control signal,
wherein the providing includes adjusting a current in a charge-pump,
wherein the providing includes adjusting a resistance in a filter.

30. The method of claim 29, wherein a phase locked loop circuit performs the method.

31. The method of claim 29, wherein the providing includes selecting an output of a multiplexer.

32. The method of claim 29, wherein the providing includes selecting an operation of an amplifier.

33. The method of claim 29, wherein the providing comprises:
providing the first control signal to the charge-pump;
providing a second control signal to a filter; and,
providing a third control signal to a multiplexer.

34. A circuit, comprising:
a phase locked loop circuit to provide an output signal in response to a comparison of an input signal and the output signal; and,
means, coupled to the phase locked loop circuit, for adjusting a frequency range of the output signal in response to a control signal,
wherein the means includes adjusting a current in a charge-pump in response to the control signal,
wherein the means includes adjusting a resistance in a filter.

* * * * *